(12) United States Patent
Smus et al.

(10) Patent No.: US 10,228,427 B2
(45) Date of Patent: Mar. 12, 2019

(54) MAGNETIC CONTROLLER FOR DEVICE CONTROL

(71) Applicant: Google LLC, Mountain View, CA (US)

(72) Inventors: Boris Smus, San Francisco, CA (US); Christian Plagemann, Palo Alto, CA (US)

(73) Assignee: GOOGLE LLC, Mountain View, CA (US)

( * ) Notice: Subject to any disclaimer, the term of this patent is extended or adjusted under 35 U.S.C. 154(b) by 191 days.

(21) Appl. No.: 14/747,818

(22) Filed: Jun. 23, 2015

(65) Prior Publication Data
US 2015/0370346 A1 Dec. 24, 2015

Related U.S. Application Data

(60) Provisional application No. 62/016,392, filed on Jun. 24, 2014.

(51) Int. Cl.
*G06F 3/03* (2006.01)
*G01R 33/02* (2006.01)
(Continued)

(52) U.S. Cl.
CPC ........... *G01R 33/02* (2013.01); *G01R 33/093* (2013.01); *G01R 33/096* (2013.01); *G05G 9/047* (2013.01);
(Continued)

(58) Field of Classification Search
CPC ...... G06F 15/16; G06F 3/0338; G06F 1/1632; G06F 1/1694; G06F 3/0202; G06F 3/038;
(Continued)

(56) References Cited

U.S. PATENT DOCUMENTS 2,930,955 A 3/1960 Andre
5,160,918 A 11/1992 Saposnik et al.
(Continued)

FOREIGN PATENT DOCUMENTS

CN 202221558 5/2012
CN 102607399 7/2012
(Continued)

OTHER PUBLICATIONS

International Search Report and Written Opinion in International Application No. PCT/US2015/037095, dated Sep. 28, 2015, 14 pages.
(Continued)

*Primary Examiner* — Lun-Yi Lao
*Assistant Examiner* — Johny Lau (57) ABSTRACT

Systems, methods and apparatus for using a magnetic controller to control device. In one aspect, a system includes a magnetic controller external to a device, the magnetic controller including: a magnetic device for altering a surrounding magnetic field of a device; one or more input actuators, each operatively coupled to the magnetic device and that when actuated cause the magnetic device alter the surrounding magnetic field according to a predefined change associated with the input actuator; and a model executable by the device and that models as device inputs the differences in the surrounding magnetic field of the device caused by the actuation of the one or more input actuators.

6 Claims, 4 Drawing Sheets

(51) Int. Cl.
*G01R 33/09* (2006.01)
*G05G 9/047* (2006.01)
*G06F 3/0338* (2013.01)
*G06F 1/16* (2006.01)
*G06F 3/02* (2006.01)
*G06F 3/038* (2013.01)

(52) U.S. Cl.
CPC .......... *G06F 1/1632* (2013.01); *G06F 1/1694* (2013.01); *G06F 3/0202* (2013.01); *G06F 3/038* (2013.01); *G06F 3/0338* (2013.01); *G05G 2009/04755* (2013.01)

(58) Field of Classification Search
CPC .......... G09G 5/08; F16K 31/08; H04W 4/00; H04W 4/02; H04W 24/00; H01R 11/30; G01R 33/02; G01R 33/093; G01R 33/096; G05G 9/047; G05G 2009/04755
See application file for complete search history.

(56) References Cited

U.S. PATENT DOCUMENTS

| | | | |
|---|---|---|---|
| 5,940,003 | A | 8/1999 | Schulz |
| 7,532,901 | B1* | 5/2009 | LaFranchise ....... H04M 1/6066 178/19.04 |
| 7,747,007 | B2 | 6/2010 | Hyun |
| 8,344,834 | B2 | 1/2013 | Niyama |
| 8,437,970 | B2 | 5/2013 | Mayor |
| 8,473,975 | B1 | 6/2013 | Besehanic |
| 8,624,695 | B2 | 1/2014 | Cretella |
| 2007/0242043 | A1 | 10/2007 | Yang et al. |
| 2007/0291112 | A1 | 12/2007 | Harris |
| 2009/0237073 | A1 | 9/2009 | Uchiyama et al. |
| 2010/0060577 | A1* | 3/2010 | Wang ...................... G01B 7/003 345/161 |
| 2010/0211345 | A1 | 8/2010 | Von Zon |
| 2011/0106954 | A1* | 5/2011 | Chatterjee ............. G06F 1/1632 709/227 |
| 2011/0163947 | A1 | 7/2011 | Shaw et al. |
| 2013/0009907 | A1* | 1/2013 | Rosenberg ............. G06F 3/046 345/174 |
| 2013/0018628 | A1 | 1/2013 | Parco |
| 2013/0057472 | A1 | 3/2013 | Dizac |
| 2013/0221254 | A1* | 8/2013 | Bachmann ............. F16K 31/02 251/65 |
| 2014/0003639 | A1 | 1/2014 | Shennib |
| 2014/0342671 | A1* | 11/2014 | Kim ...................... H04W 4/008 455/41.3 |
| 2015/0370346 | A1 | 12/2015 | Smus et al. |

FOREIGN PATENT DOCUMENTS

| | | |
|---|---|---|
| CN | 102646081 | 8/2012 |
| CN | 103345311 | 10/2013 |
| CN | 203264252 | 11/2013 |
| EP | 2194694 | 2/2015 |

OTHER PUBLICATIONS

Translation of First Office Action dated Aug. 27, 2018 for Chinese Application No. 201580034547.6, 41 pages.

* cited by examiner

MAGNETIC CONTROLLER FOR DEVICE CONTROL

CROSS-REFERENCE TO RELATED APPLICATIONS

This application claims the benefit under 35 U.S.C. § 119(e) of U.S. Patent Application No. 62/016,392, titled "Magnetic Controller For Device Control," filed Jun. 24, 2014. The disclosure of the foregoing application is incorporated herein by reference in its entirety for all purposes.

BACKGROUND

Mobile devices are currently one of the most popular types of electric devices. For example, cellular phones continue to expand their domain of connectivity to allow users to access their email, and music, as well as play games on their cellular phones. Likewise, tablet computers are designed with a convenient form factor that supports ease of portability. Since mobile devices became an integral part of everyday life, many applications are now available for mobile devices.

Many of these applications, and the mobile device itself, can be controlled using touch screen controls or buttons on the mobile device. Furthermore, many mobile devices can mate with peripheral docks, such as a dock with a keyboard and other controls, to allow the user utilize a larger input device for the mobile device when convenient, e.g., when sitting down and not moving about.

Many mobile devices are now often equipped with a magnetometer that allows the devices to detect the surrounding magnetic field. The magnetometer is traditionally used to provide a digital compass on the mobile device.

SUMMARY

This specification relates to a magnetic controller for data input. In particular, the specification relates to utilizing a magnetometer of a user device, such as a smart phone or table, or even a desk top computer is the computer is so equipped, to interpret magnetic field changes caused by the magnetic controller as input.

In general, one innovative aspect of the subject matter described in this specification can be embodied in a method including the actions of determining, by a magnetometer of a device, a reference magnetic field measurement, the reference magnetic field measurement specifying a strength and a direction of a surrounding magnetic field that surrounds the magnetometer; determining, by the magnetometer of a device, a series of subsequent magnetic field measurements, each subsequent magnetic field measurement specifying a strength and a direction of a surrounding magnetic field that surrounds the magnetometer; for each subsequent magnetic field measurement: determining, by a processor of the device, a difference between the reference magnetic field measurement and the subsequent magnetic field measurement, determining, by the processor of the device, whether the difference between the reference magnetic measurement and the subsequent magnetic field measurement meets a threshold change; for each difference that does not meet the threshold change, not interpreting the difference as a user input to the device; and for each difference that does meet the threshold change, determining, based on an input model that models differences in the surrounding magnetic field for a plurality of user inputs, a user input to the device.

Another innovative aspect of the subject matter described in the specification can be embodied in a system including a magnetic controller external to a device, the magnetic controller including: a magnetic device for altering a surrounding magnetic field of a device; one or more input actuators, each operatively coupled to the magnetic device and that when actuated cause the magnetic device alter the surrounding magnetic field according to a predefined change associated with the input actuator; and a model executable by the device and that models as device inputs the differences in the surrounding magnetic field of the device caused by the actuation of the one or more input actuators. Another innovative aspect of the subject matter described in the specification can be embodied in a system including a data processing apparatus including a processing subsystem and a magnetometer, the data processing apparatus operable to: determine, by the magnetometer, a reference magnetic field measurement, the reference magnetic field measurement specifying a strength and a direction of a magnetic field that surrounds the magnetometer; determining, by the magnetometer, a series of subsequent magnetic field measurements, each subsequent magnetic field measurement specifying a strength and a direction of a surrounding magnetic field that surrounds the magnetometer; for each subsequent magnetic field measurement: determining, by the processing subsystem, a difference between the reference magnetic field measurement and the subsequent magnetic field measurement, determining, by the processing subsystem, whether the difference between the reference magnetic measurement and the subsequent magnetic field measurement meets a threshold change; for each difference that does not meet the threshold change, not interpreting the difference as a user input to the data processing apparatus; and for each difference that does meet the threshold change, determining, based on an input model that models differences in the surrounding magnetic field for a plurality of inputs, a user input to the data processing apparatus; and magnetic controller external to the data processing apparatus, the magnetic controller including: a magnetic device for altering the surrounding magnetic field; one or more input actuators, each operatively coupled to the magnetic device and that when actuated cause the magnetic device alter the surrounding magnetic field according to a predefined change associated with the input actuator.

Another innovative aspect of the subject matter described in the specification can be embodied in a method including determining, by a magnetometer of a device, a transient variation in a magnetic field; determining, by the processor of the device, whether the transient variation in the magnetic field meets a threshold change; for each transient variation that does not meet the threshold change, not interpreting the transient variation an input to the device; and for each transient variation that does meet the threshold change, determining, based on an input model that models transient variations in the surrounding magnetic field to a plurality of inputs, each transient variation uniquely corresponding on a corresponding input, a user input to the device.

Another innovative aspect of the subject matter described in the specification can be embodied in a system including a magnetic controller external to a device, the magnetic controller including: an electromagnetic device for altering a surrounding magnetic field of a device; a plurality of input actuators, each operatively coupled to a controller and that generate a user input signal for the controller, and wherein the controller generates, for each input signal, a correspondingly unique signal to drive the electromagnetic device to generate a transient variation in the magnetic field that uniquely corresponds to the input; and a model executable by the device and that models as device inputs the transient variation in the surrounding magnetic field of the device caused by the actuation of the one or more input actuators.

Particular embodiments of the subject matter described in this specification can be implemented so as to realize one or more of the following advantages. The systems described in this specification allow devices to interpret commands from magnetic controllers. The magnetic controllers may be either passive or active. Passive controllers do not require nor consume power. Active controllers may be easier to calibrate and optimize relative to a passive controller for optimization with a particular device.

The magnetic controller allows wireless control of mobile devices and need not conform to proprietary or standardized communication protocols. Finally, the magnetic controller does not require alteration of the hardware of controlled devices that include magnetometers.

The details of one or more embodiments of the subject matter described in this specification are set forth in the accompanying drawings and the description below. Other features, aspects and advantages of the subject matter will become apparent from the description, the drawings and the claims.

BRIEF DESCRIPTION OF THE DRAWINGS

Like reference numbers and designations in the various drawings indicate like elements.

DETAILED DESCRIPTION

The subject matter below relates to systems and methods where magnetic controllers are used in combination with a user device to control the user device. In the examples below, the magnetic controller is described in the context of a mobile device. However, the principals of the magnetic controller can be used for other devices that have magnetometers, such as wearable devices, tablet devices, and event desktop and tablet devices.

Figure 1A:
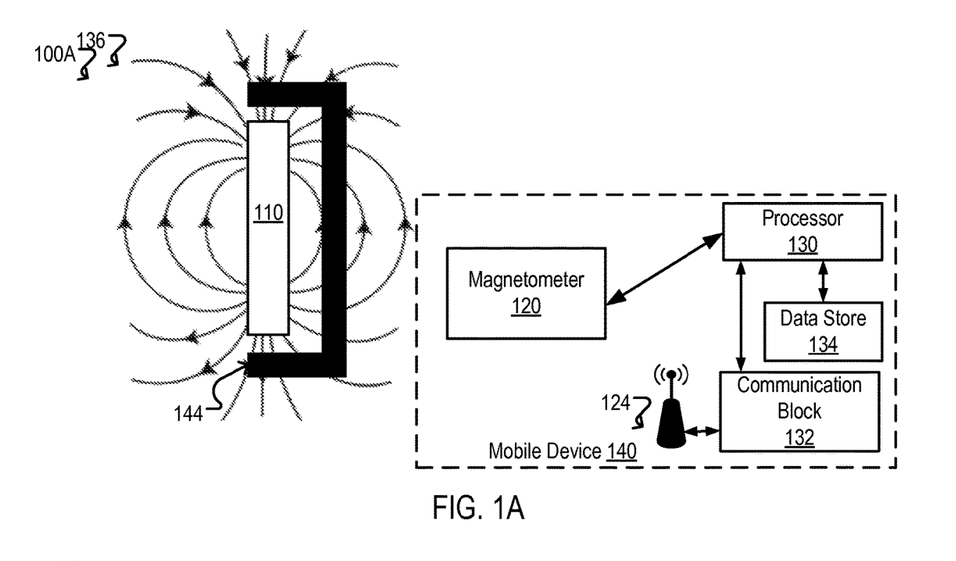
FIGS. 1A and 1B are block diagrams of an example implementation of a system including a passive wireless magnetic controller for a device.
Figure 1B:
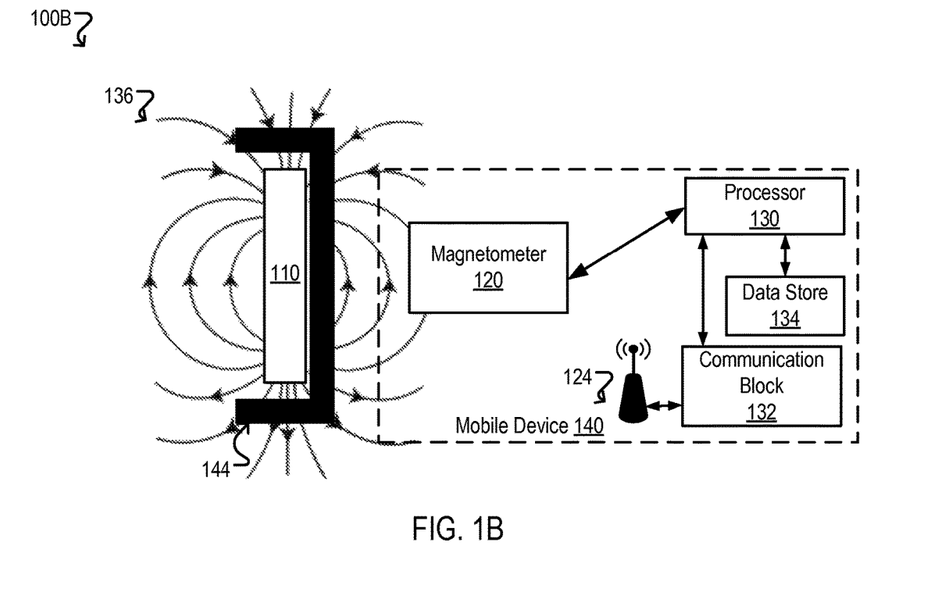

FIGS. 1A and 1B are block diagrams of an example implementation of a system that includes a magnetic controller 144 for a device, such as a mobile device 140. In the example shown, the magnetic controller 144 is a button actuator, and is external to the mobile device 140.

The mobile device 140 includes a magnetometer 120 in communication with the processor 130. The magnetometer generates magnetic field measurements periodically or in response to a request by processor 130. These series of magnetic field measurements may be represented as a series of space vectors, each vector having a magnitude value and a direction value. The direction value may be a 3-dimensional direction in a 3-dimensional space.

The processor 130 performs calculations and processes data received from different components of the mobile device 140. For example, the processor 130 is in communication with communication block 132 and magnetometer 120. The communication block 132 is responsible for transmitting and receiving data through wireless transceiver 126. The wireless transceiver 126 is connected to communication block 132 and is capable of transmitting as well as receiving signals.

The mobile device 140 also includes a data store 134 that stores instructions, applications and the like that are executable by the processor 130. As will be described in more detail below, the data store 134 stores an input model that models differences in the surrounding magnetic field for a plurality of user inputs. The processor 130 compares the magnetic field measurements, determines changes relative to a reference magnetic field measurement, and consults the model to determine a corresponding user input to the mobile device.

In some implementations, the input model may be a machine learned classifier. The classifier may be trained with positive and negative data samples, where positive data samples are corresponding to an input being actuated (e.g., a button being pressed), and negative data samples correspond to an input not being actuated. The model is then learned based on the date samples. For example, with reference to FIGS. 1A and 1B, a first set of measurements at magnetometer 120 are obtained when the magnet 110 is not depressed. The first set corresponds to negative data samples. Similarly, a second set of measurements at the magnetometer 120 when the magnet 110 is pressed are obtained and correspond to positive data samples. The first and second sets of measurements at magnetometer 120 may be used to train the machine learning classifier to differentiate between measurements obtained for the magnet 110 being pressed and the magnet 110 not being pressed.

In some implementations the classifier may be trained in an environment containing a specific amount of interference. For example, a nominal background magnetic field may be determined from a variety of environments, and may be induced when training the classifier.

Additional sets of measurements may be used to train more complex models. For example, a device with multiple inputs, e.g., multiple buttons and a joystick, may be capable of generating multiple different sets of data—various combinations of button actuations and joystick positions—to train a model to determine the different combinations.

In FIG. 1A, the magnetic controller 144 has a magnet 110 positioned in a first position. For example, the magnet 110 may be integrated into a keyboard key. When the magnet 110 is not depressed as shown in FIG. 1A, the magnetic field 136 produced by the magnet generated by the magnet is relatively weak at the area surrounding magnetometer 120. However, when the magnet 110 is depressed, as shown in FIG. 1B, it is displaced closer to the magnetometer 120. Moving the magnet 110 to this second position causes the magnetic field 136 to be stronger at the area surrounding magnetometer 120 than when the magnet was not depressed.

The processor 130 receives the readings of the magnetometer 120 and can differentiate between the magnetic fields produced when magnet 110 is in the first position and when magnet 110 is in the second position. For example, the readings provided by the magnetometer are transferred to processor 130. In turn, the processor 130 interprets the magnet being in the first and second position as different inputs, based on the magnetic field produced by the magnet in each position.

In operation, the magnetometer 120 of the device 140 generates a reference magnetic field measurement. The reference magnetic field measurement specifies strength and a direction of a surrounding magnetic field that surrounds the magnetometer 120. For example, when a user desires to use the magnetic controller 144, software on the mobile device 140 may take a reference reading of the magnetic field. This reference reading is then used to determine differences in the magnetic field caused by the magnetic controller 144.

The magnetometer 120 then provides a series of subsequent magnetic field measurements to the processor 130. Each subsequent magnetic field measurement specifies strength and a direction of a surrounding magnetic field that surrounds the magnetometer 120. For each subsequent magnetic field measurement, the processor 130 determines a difference between the reference magnetic field measurement and the subsequent magnetic field measurement, and then determines whether the difference between the reference magnetic measurement and the subsequent magnetic field measurement meets a threshold change. The threshold change can be used to ensure that minor disturbances in the magnetic field are not interpreted as user inputs, and that changes in orientation of the device in an ambient magnetic field (e.g., Earth's magnetic field) are also not interpreted as user inputs. Accordingly, the threshold change can selected to distinguish between an orientation change in the user device where the ambient magnetic field is relatively undisturbed, and an induced change to the magnetic field by a control device, where the induced change significantly alters the surrounding ambient magnetic field. The induced changes can thus be mapped to a user input control model.

In some implementations, the threshold change can be selected based on the magnetic controller type. For example, a magnetic controller may, by use of magnets, cause at least a minimum change in the magnetic field surrounding the magnetometer 120 when the magnetic controller is used as specified (e.g., within a certain distance of the device 140). The threshold is selected to be slightly less than the minimum change, and is stored in a model that is generated for the magnetic controller 144.

For each difference that does not meet the threshold change, the processor 130 does not interpret the difference as an input to the mobile device 140. Conversely, for each difference that does meet the threshold change, the processor 130 determines a corresponding input based on an input model that models differences in the surrounding magnetic field for a plurality of inputs.

In some implementations, the model can be provided with software that accompanies the magnetic controller 144. The model can describe a mapping of the magnetic field changes to inputs supported by the magnetic controller 144. The mapping can be determined, for example, by the manufacturer of the magnetic controller 144. In other implementations, the processor 130 can execute a learning program that prompts the user to perform inputs using the magnetic controller 144, and then monitors the changes in the magnetic field. These changes are then stored in the data store 134 as the input model.

Other types of magnetic controllers other than the controller of FIG. 1 can be used. For example, FIGS. 2A-2C are block diagrams of different types of magnetic controllers.

Figure 2A:
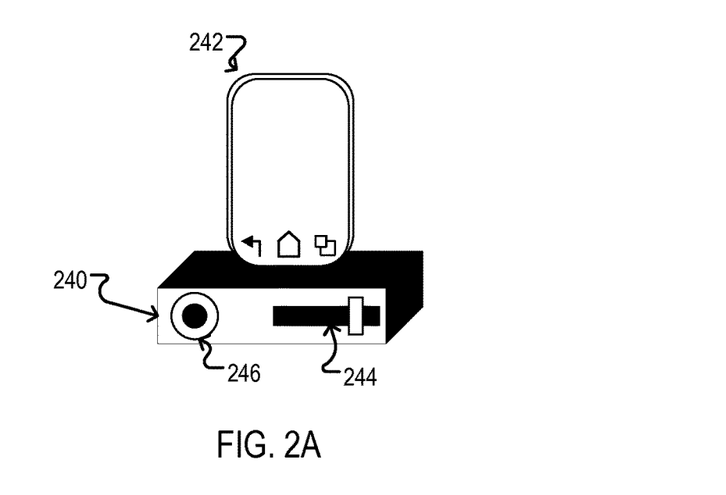
FIGS. 2A-2C are block diagrams of different types of magnetic controllers.
Figure 2B:
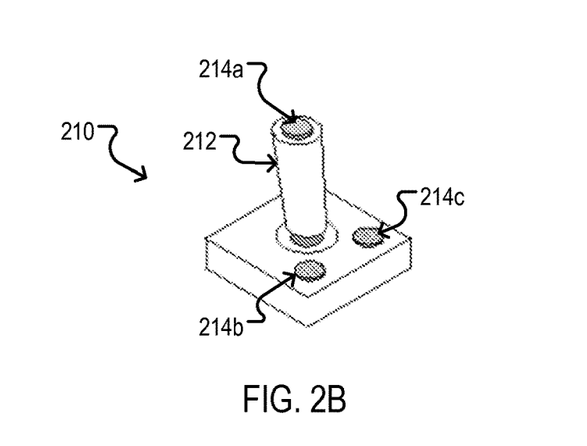
Figure 2C:
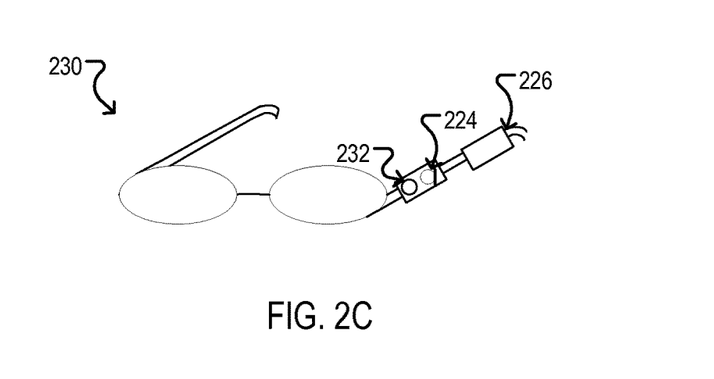

FIG. 2A illustrates one type of magnetic controller that is a magnetic dock 240 that receives a mobile device 242. In some implementations, magnetic dock 240 is a passive magnetic dock that includes one or more magnets that are respectively connected to one or more actuators. In an alternate implementation, the dock 240 may be an active dock that is powered and in which the actuators are connected to a processing system that, in turn, drives one or more electromagnets to manipulate a magnetic field in response to activation of the actuators.

The magnetic dock 240 may include one or more input actuators. For example, magnetic dock 240 may include a magnetic slider 244 and a magnetic knob 246. In one implementation the magnetic slider 244 may be used to control the volume of the mobile device 242 while knob 246 may be used to control navigation of the mobile device. Both actuators 244 and 246 are each operatively coupled to a magnetic device and when actuated cause the magnetic device alter the surrounding magnetic field according to a predefined change associated with the input actuator.

The mobile device 242 may detect placement in dock 240. In one implementation mobile device 242 detects placement in dock 240 by determining the mobile device orientation. For example, if dock 240 is designed to hold the mobile device vertically 15 degrees from an upright position, when the mobile device 240 determines that its orientation is vertical and 15 degrees from an upright position, the mobile device may determine that it is in the dock 240. In another implementation, the mobile device 240 determines its orientation using magnetometer 120 and sensing for a reference magnetic field that may be present when mounted in the dock 240. When the processor determines the mobile device is in the dock 240, it will interpret the changes in the magnetic fields as commands; however, if the mobile device is not within the dock, the processor will not interpret the changes in the magnetic fields as commands.

The dock 240 may be implemented as a passive magnetic dock. Operating control elements, such as slider 244 and knob 246, may cause mechanical displacements of magnets within the dock 240. Moving magnets within dock 240 causes alteration of a magnetic field surrounding mobile device 242. As described above, the magnetometer 120 detects changes to the surrounding magnetic field and interprets such changes as input to the mobile device. Moving the slider 242 may cause a magnet to be mechanically moved within dock 240. When the mobile device detects the change in the surrounding magnetic field of device 242, the processor 130 may interpret the change as, for example, a command to raise the volume of the device.

In another implementation dock 240 is an active dock. Active magnetic controllers require power to operate and use electrical current to induce a magnetic field in the area surrounding mobile device 242. A magnetic field may be induced by transferring current in a particular path, for example, a coil. The intensity of the magnetic field may be controlled by controlling the magnitude of the current in the particular path. For example, the slider 244 and knob 246 may be used to alter the magnitude and path of the current within the dock 240, which in turn alters the magnitude and direction of the magnetic field surrounding the device 242. Slider 244 and knob 246 may control a variable resistance in the path of the electrical current used to induce the magnetic field. Similar to the description above with respect to passive docks, when the mobile device detects the change in the surrounding magnetic field of device 242, the processor 130 may interpret the change as, for example, a command to lower the volume of the device.

FIG. 2B depicts a magnetic video game controller 210. The magnetic video game controller 210 may include one or more buttons 214a-214c and a joy stick 212. In some implementations, the joy stick 212 is used to move video game objects across the display of a controlled device, such as a tablet, while the buttons 214a-214c are used to initiate specific video game actions. For example, the joy stick 212 may be used to steer a car in a video game, while the button 214 may be used activate the car's breaks. Similar to the discussion above with respect to the dock 240, the magnetic video game controller 210 may be either passive or active. A passive magnetic video game controller may include a plurality of magnets, each magnet being mechanically movable within the controller. For example, joystick 212 may contain a longitudinal magnet that moves as a user moves the stick 212, while the buttons 214a-214c may each include a magnet that can be moved in response to the user pressing the respective button. The resultant magnetic field from moving joystick 212 and the buttons 214a-214c can be detected using magnetometer 130 of mobile device 242. The processor 130 can interpret the resultant magnetic fields as instructions. For example, the processor 130 can determine that the stick 212 was moved to the left, and in turn, move a car in a video game left.

FIG. 2C depicts a wearable computer device 230 equipped with a magnetic controller 232. The device 230 may include a magnetic button 232, a microphone 224 and electronics 226, which include a magnetometer. In one implementation, the magnetic button 232 may be used to activate the microphone 224 for the device 230 so that the microphone 224 may be used to receive the voice commands from users. Button 232 may be implemented using a passive or active magnetic device.

Figure 3:
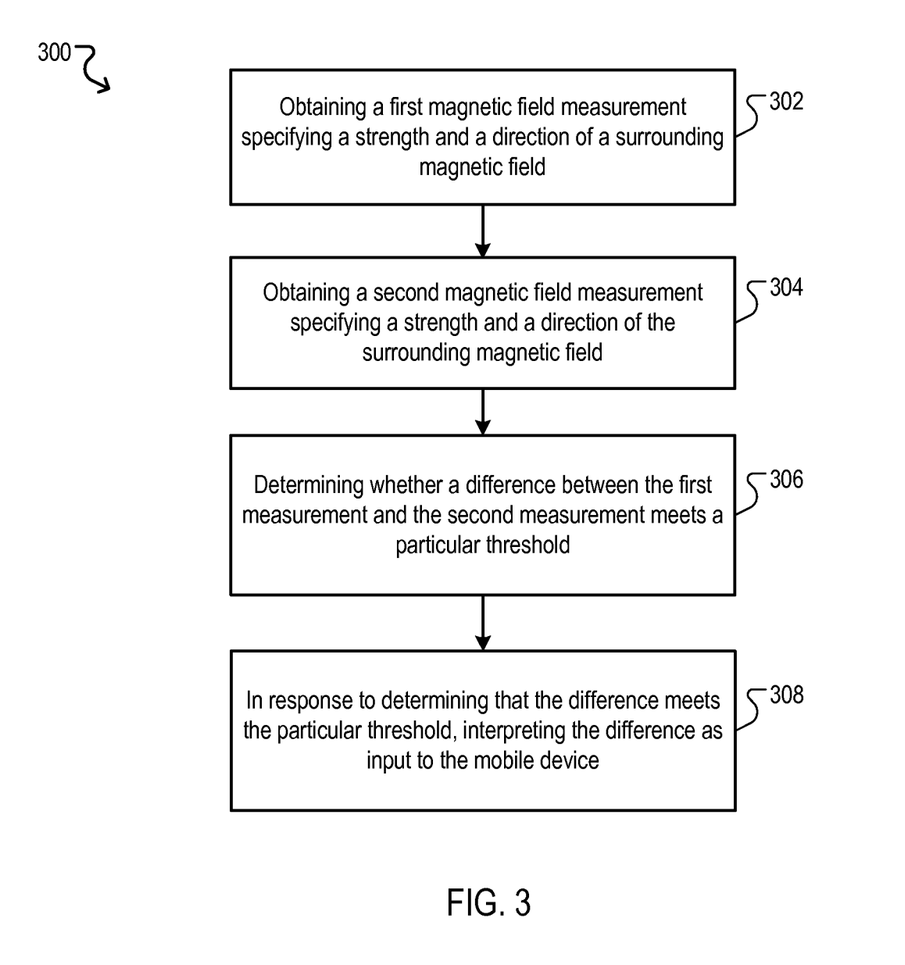
FIG. 3 is a flow chart of an example process for controlling a device equipped with a magnetometer using a magnetic controller.

FIG. 3 is a flow chart of an example process 300 for controlling a device equipped with a magnetometer, using a magnetic controller. The process 300 starts with obtaining a first magnetic field measurement specifying a strength and a direction of a surrounding magnetic field (302). For example, this measurement may be obtained by magnetometer 130 of a mobile device. In one implementation, the strength is specified by a magnitude and the direction is specified in a 3-dimensional space. In some implementations, the magnetic field may be represented by one or more 3-dimensional vectors. This first measurement specifies the net resultant magnetic field in the area surrounding the mobile device, prior to activating the magnetic controller, and is used as a reference magnetic field. For example, the first measurement may specify the net resultant magnetic field of the earth in combination with electric devices in the surrounding area such as power lines or phones.

An alteration of the surrounding magnetic field occurs when the magnetic controller is used. The process 300 obtains a second magnetic field measurement specifying strength and a direction of the surrounding magnetic field (304). The second measurement may be obtained by magnetometer 130 of the mobile device. In one implementation the strength is specified by a magnitude and the direction is specified in a 3-dimensional space. In some implementations, the magnetic field may be represented by one or more 3-dimensional vectors. This second measurement specifies the net resultant magnetic field in the area surrounding the mobile device, after the net magnetic field is altered by the magnetic controller.

The process 300 continues by determining whether a difference between the first measurement and the second measurement meets a particular threshold (306). The determination may be performed by processor 130 of the mobile device. The determination may be performed by comparing the vectors from the first magnetic field measurement to vectors from the second magnetic field measurement. The threshold may specify a minimum change in magnitude as well as a minimum change in direction. As described above, the direction may be specified in a 3-dimensional space. The particular threshold may be defined based on an expected magnetic interference of the environment the mobile device operates and stored in the input model. The design parameters of the magnetic controller may be used to take into consideration the interference levels expected in the operation environment.

In response to determining that the difference meets the particular threshold the process 300 interprets the difference as input to the mobile device (308). Conversely, if the process 300 determines that the difference does not meet the particular threshold, the process 300 may not interpret the difference as input to the mobile device.

In some implementations, the mobile device performs an action in response to the determination that the difference meets the particular threshold. Different actions are described by respective input models for the different magnetic controllers above.

Figure 4:
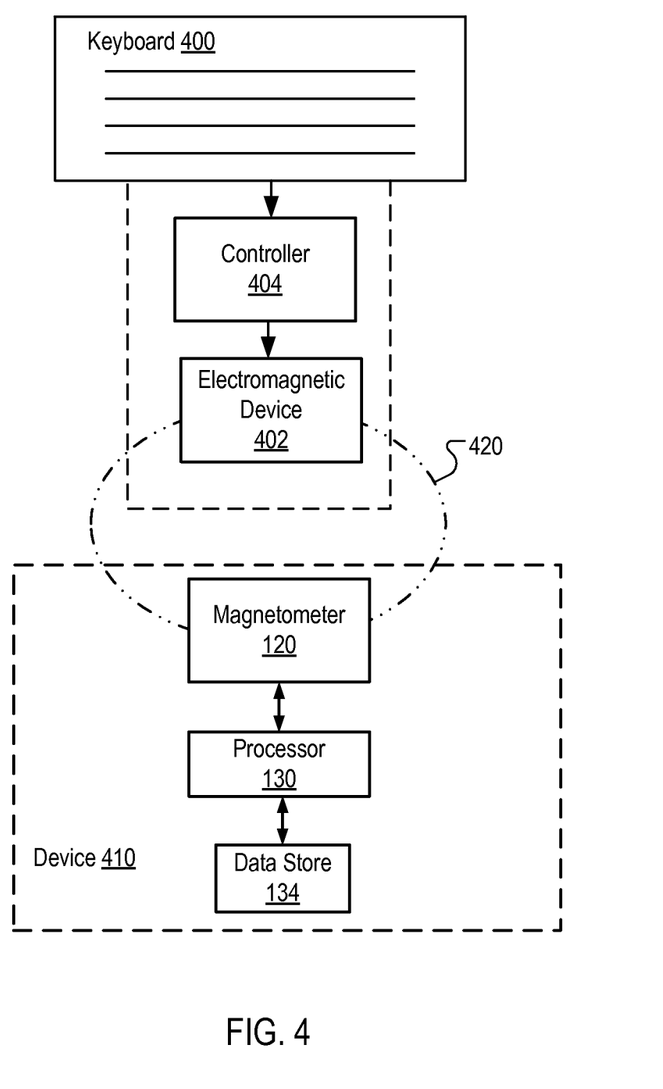
FIG. 4 is a block diagram of an example multi-input device with an electronically controlled electromagnetic device.

As described above, the difference in a magnetic field may be measured relative to a reference magnetic field. However, in implementations in which an active magnetic device is used, the magnetic field may vary according to a predefined pattern to encode a user input command. For example, a keyboard device may include a controller that drives one or more electro magnets. One example implementation is shown in FIG. 4, which is a block diagram of an example multi-input device 400 (e.g., a keyboard) with an electronically controlled electromagnetic device 402. Each keyboard key press or combination of key presses causes a controller 404 to generate a correspondingly unique signal to drive the electromagnetic device 402, which, in turn, corresponds to a unique variance in the magnetic field surrounding the magnetometer 120 in a device 410. The variance is indicated by the coupling 420. The variances may be in the direction of the vector, the magnitude of the vector, or a combination of both. For example, a pressing of the "j" key may cause a first temporary shift (e.g., 50 milliseconds) in the magnetic field at a first magnitude and direction generated by the magnetic device, while the pressing the "k" key may cause a second temporary shift in the magnetic field at a second magnitude and direction. A mapping of the variances to inputs is stored in an input model in the data store 134, and these magnetic field transient variations are detected by the magnetometer 120 and interpreted as corresponding user input commands by the processor 130. The transient variations that are detected can also be subject to meeting a minimum magnetic field change in order to be acted upon.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Moreover, the separation of various system components in the embodiments described above should not be understood as requiring such separation in all embodiments, and it should be understood that the described components and systems can generally be integrated together in a single product.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A method to control a computer peripheral device, comprising:
  determining, by a magnetometer of the device, a magnetic field measurement specifying a strength and a direction of a surrounding magnetic field that surrounds the magnetometer;
  determining whether the device is to be controlled by a particular magnetic controller of a plurality of different magnetic controllers based on the magnetic field measurement indicating a respective reference magnetic field measurement that is present when the device is placed within a magnetic field of the particular magnetic controller, wherein:
    each different magnetic controller includes a plurality of respective magnetic input actuators that are each operatively coupled to a respective magnetic device and that when manually actuated by a user causes a respective magnetic controller to alter the surrounding magnetic field according to a predefined change associated with the plurality of respective magnetic input actuators;
    each different magnetic controller is a different type of magnetic controller of a plurality of types of magnetic controllers; and
    each respective type of magnetic controller has a different respective reference magnetic field measurement and a different respective input model of a plurality of input models;
  in response determining that the device is not to be controlled by the particular magnetic controller external to the device, not interpreting changes to magnetic fields as commands; and
  in response determining that the device is to be controlled by the particular magnetic controller external to the device:
    selecting a respective input model for the particular magnetic controller from the plurality of input models based on a respective type of the particular magnetic controller which is determined from the respective reference magnetic field measurement, wherein the respective input model maps magnetic field changes caused by user actuation of the plurality of magnetic input actuators to a plurality of user inputs supported by the particular magnetic controller, wherein each respective input model describes different actions for each respective magnetic controller;
    determining, by the magnetometer of the device, a series of subsequent magnetic field measurements, each subsequent magnetic field measurement specifying a strength and a direction of a surrounding magnetic field that surrounds the magnetometer and generated by actuation of the particular magnetic controller to which the reference magnetic field measurement corresponds;
    for each subsequent magnetic field measurement:
      determining, by a processor of the device, a difference between the respective reference magnetic field measurement that is present when the device is placed within the magnetic field of the respective magnetic controller and the subsequent magnetic field measurement;
      determining, by the processor of the device, whether the difference between the respective reference magnetic measurement and the subsequent magnetic field measurement meets a threshold change according to the respective input model; and
      for each difference that does meet the threshold change, determining, based on the respective input model, a user input to the device based on the respective input model.

2. The method of claim 1, further comprising:
  for each difference that does not meet the threshold change, not interpreting the difference as a user input to the device.

3. The method of claim 1, wherein:
  the magnetic field measurements specify a three-dimensional magnetic field vector and a magnitude of the three-dimensional magnetic field vector; and
  the respective input model maps changes in the three-dimensional magnetic field vector and changes in the magnitude of the three-dimensional magnetic field vector to a plurality of inputs.

4. The method of claim 3, wherein the respective input model maps the changes in the three-dimensional magnetic field vector and changes in the magnitude of the three-dimensional magnetic field vector to a plurality of inputs by mapping each of the plurality of inputs to discrete changes in a direction of the three-dimensional magnetic field vector and discrete changes in the magnitude of the three-dimensional magnetic field vector to a plurality of input.

5. The method of claim 1, further comprising:
  determining an orientation of the device relative to the particular magnetic controller that is external to the device; and
  wherein determining, based on the respective input model, a user input to the device based on the respective input model comprises determining the user input to the device only if the orientation of the device relative to the respective reference magnetic field meets an orientation criterion that defines an orientation of the device relative to the respective magnetic controller.

6. A computer peripheral device, comprising:
  a data processing apparatus including a processing subsystem and a magnetometer, the data processing apparatus operable to:
    determine, by the magnetometer of the device, a magnetic field measurement, the magnetic field measurement specifying a strength and a direction of a surrounding magnetic field that surrounds the magnetometer;
    determine whether the device is to be controlled by a particular magnetic controller of a plurality of different magnetic controllers based on the magnetic field measurement indicating a respective reference magnetic field measurement that is present when the device is placed within a magnetic field of the particular magnetic controller, wherein:
      each different magnetic controller includes a plurality of respective magnetic input actuators that are each operatively coupled to a respective magnetic device and that when manually actuated by a user causes a respective magnetic controller to alter the surrounding magnetic field according to a predefined change associated with the plurality of respective magnetic input actuators;

each different magnetic controller is a different type of magnetic controller of a plurality of types of magnetic controllers; and each respective type of magnetic controller has a different respective reference magnetic field measurement and a different respective input model of a plurality of input models;

in response determining that the device is not to be controlled by the particular magnetic controller external to the device, not interpreting changes to magnetic fields as commands; and in response determining that the device is to be controlled by the particular magnetic controller external to the device:

select a respective input model for the particular magnetic controller from the plurality of input models based on a respective type of the particular magnetic controller which is determined from the respective reference magnetic field measurement, wherein the respective input model maps magnetic field changes caused by user actuation of the plurality of magnetic input actuators to a plurality of user inputs supported by the particular magnetic controller, wherein each respective input model describes different actions for each respective magnetic controller;

determine, by the magnetometer of the device, a series of subsequent magnetic field measurements, each subsequent magnetic field measurement specifying a strength and a direction of the surrounding magnetic field that surrounds the magnetometer and generated by actuation of the particular magnetic controller to which the reference magnetic field measurement corresponds;

for each subsequent magnetic field measurement:

determine, by a processor of the device, a difference between the respective reference magnetic field measurement that is present when the device is placed within the magnetic field of the respective magnetic controller and the subsequent magnetic field measurement;

determine, by the processor of the device, whether the difference between the respective reference magnetic measurement and the subsequent magnetic field measurement meets a threshold change according to the respective input model; and for each difference that does meet the threshold change, determine, based on the respective input model, a user input to the device based on the respective input model; and a magnetic controller of the plurality of different magnetic controllers external to the data processing apparatus, the magnetic controller including:

a magnetic device for altering the surrounding magnetic field; and one or more magnetic input actuators, each operatively coupled to the magnetic device and that when actuated cause the magnetic device alter the surrounding magnetic field according to a predefined change associated with the magnetic input actuator.

* * * * *